United States Patent [19]

Hotta

[11] Patent Number: 4,710,265
[45] Date of Patent: Dec. 1, 1987

[54] METHOD OF PRODUCING SEMICONDUCTOR INTEGRATED CIRCUIT HAVING PARASITIC CHANNEL STOPPER REGION

[75] Inventor: Tadahiko Hotta, Hamamatsu, Japan

[73] Assignee: Nippon Gakki Seizo Kabushiki Kaisha, Hamamatsu, Japan

[21] Appl. No.: 938,010

[22] Filed: Dec. 4, 1986

[30] Foreign Application Priority Data

Nov. 30, 1985 [JP] Japan ................................ 60-270325

[51] Int. Cl.$^4$ .................... H01L 21/22; H01L 21/38; B44C 1/22; C03C 15/00
[52] U.S. Cl. ..................................... 437/29; 156/648; 156/657; 156/661.1; 156/662; 357/44; 437/41
[58] Field of Search ................ 29/571, 576 B, 576 W, 29/578; 148/1.5, 187, 188, 189, 190, 33, 33.1, 33.3, 33.6; 427/85, 93; 156/648, 653, 657, 659.1, 661.1, 662; 357/42, 44

[56] References Cited

U.S. PATENT DOCUMENTS

| | | | |
|---|---|---|---|
| 4,435,896 | 3/1984 | Parrillo et al. ................... | 29/578 X |
| 4,466,171 | 8/1984 | Jochems ................................ | 29/571 |
| 4,558,508 | 12/1985 | Kinney et al. ....................... | 29/571 |
| 4,567,640 | 2/1986 | Fang et al. .......................... | 29/578 X |
| 4,577,391 | 3/1986 | Hsia et al. ............................ | 29/571 |

*Primary Examiner*—William A. Powell
*Attorney, Agent, or Firm*—Spensley Horn Jubas & Lubitz

[57] ABSTRACT

A complementary MOS type integrated circuit is produced by a method which comprises the steps of: disposing a first mask material layer on the surface of a semiconductor substrate, the first mask material layer having a first impurity introducing region corresponding to a desired well forming pattern; forming a well region by selectively doping an impurity into the surface of the substrate through the first impurity introducing region; forming a second mask material layer in such a manner as to cover both the first impurity introducing region and the first mask material layer; disposing first and second mask layers on the second mask material layer, the first and second mask layers respectively corresponding to a first active region pattern within the well region and a second active region pattern outside the well region, thereby defining a second impurity introducing region corresponding to a desired parasitic channel stopper pattern between the stack portion of the first and second mask material layers and the first mask layer; selectively ion-implanting an impurity into the surface of the well region through the second impurity introducing region; selectively removing the first and second mask material layers by selective etching using the first and second mask layers; and selectively thermally oxidizing the surface of the substrate using the remaining portions of the first and second mask material layers as a mask, thereby simultaneously forming a field oxide film and a parasitic channel stopper region containing the implanted impurity. According to this method, the parasitic channel stopper region is self-aligned with both the well region and the field oxide film.

6 Claims, 11 Drawing Figures

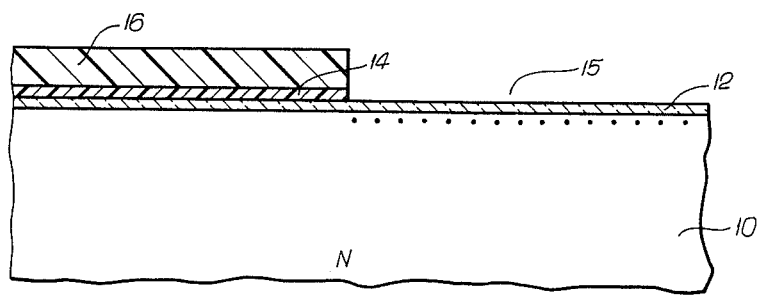
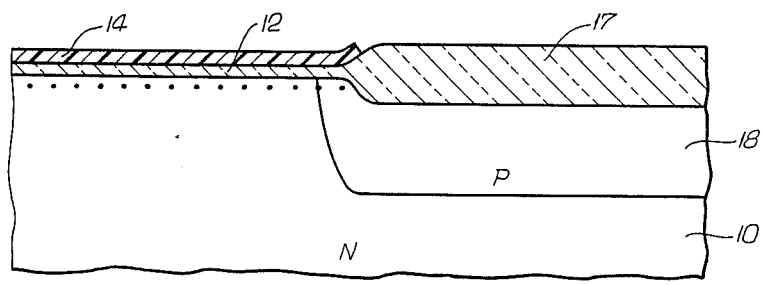
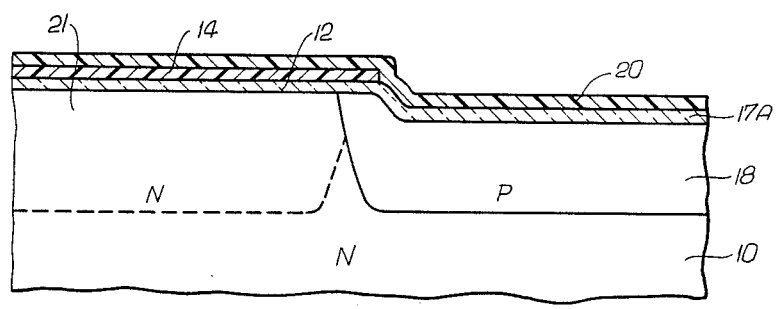

METHOD OF PRODUCING SEMICONDUCTOR INTEGRATED CIRCUIT HAVING PARASITIC CHANNEL STOPPER REGION

BACKGROUND OF THE INVENTION

1. Field of the Invention

This invention relates to a method of producing a semiconductor integrated circuit, and more particularly to a method of producing a complementary MOS (Metal-Oxide-Semiconductor) type integrated circuit (hereinafter referred to as a "CMOS type IC" having a parasitic channel stopper region which is self-aligned with both a well region and a field oxide film.

2. Description of the Prior Art

As a method of forming a well region and a parasitic channel stopper region in a CMOS type IC, one such as that shown in FIGS. 1a and 1b has heretofore been known.

This conventional method will be explained below.

Referring first to FIG. 1a, a P-type well region 2 is formed in a surface region of an N-type silicon substrate 1, and a silicon nitride film 4 is deposited on the upper surface of the substrate 1 through a thin silicon oxide film 3 in such a manner as to cover the well region 2. Then, a photoresist layer 5 is formed on the silicon nitride film 4, the layer 5 having an opening corresponding to a desired parasitic channel stopper pattern, and with this photoresist layer 5 used as a mask, the silicon nitride film 4 is selectively etched to provide a hole 4a which corresponds to the parasitic channel stopper pattern. Thereafter, boron ions are selectively implanted into the surface of the substrate 1 using the photoresist layer 5 and the silicon nitride film 4 as a mask and through the silicon oxide film 3.

Then, as shown in FIG. 1b, the silicon nitride film 4 is provided with a hole 4A for selective oxidation by a photolithography technique, and with this film 4 used as a mask, selective oxidation is carried out to form a field oxide film 6, together with a P+-type parasitic channel stopper region 7 which is located directly below the film 6, the region 7 containing the boron which has been implanted in advance.

According to the above-described conventional method, the hold 4a is formed in the step shown in FIG. 1a using a photomask in such a manner that the hole 4a is aligned with the P-type well region 2. In consequence, boron ions may be undesirably implanted into a portion which extends from the end edge of the region 2 by a width W due to a possible error in the alignment using the mask. As a result, the P+-type parasitic channel stopper region 7 may be formed such as to extend outward from the P-type well region 2 as shown in FIG. 1b. This leads to a reduction in the packing density, unfavorably.

In addition, the step shown in FIG. 1b needs a photolithography step including alignment using a photomask for forming the hole 4A, which means that a total of three photolithography steps are needed to obtain the structure shown in FIG. 1b, including the step which is carried out when the P-type well region 2 is formed. It is necessary, in order to increase the packing density and reduce the production cost, to reduce the number of photolithography steps.

SUMMARY OF THE INVENTION

It is a primary object of the present invention to provide a method which enables production of a high packing density CMOS type IC having a parasitic channel stopper region self-aligned with one or more well regions and a field oxide film in a minimized number of steps.

According to the present invention, a CMOS type IC is produced as follows. A semiconductor substrate of a first conductivity type and with a principal surface is prepared. A first mask material layer having a first impurity introducing region which corresponds to a predetermined well forming pattern is disposed on the principal surface. A first impurity which determines a second conductivity type opposite to the first conductivity type is selectively doped into the principal surface through the first impurity introducing region, whereby a well region is formed in the principal surface, the well region having the second conductivity type, which is determined by the first impurity.

Then, a second mask material layer is formed in such a manner as to cover both the first impurity introducing region and the first mask material layer. Firsts and second mask layers which respectively correspond to a first active region pattern within the well region and a second active region pattern outside the well region are stacked on the second mask material layer, whereby a second impurity introducing region which corresponds to a predetermined parasitic channel stopper pattern is defined between the stack portion of the first and second mask material layers and the first mask layer. Thereafter, a second impurity which determines the second conductivity type is selectively ion-implanted into the surface of the well region through the second impurity introducing region, and the first and second mask material layers are selectively removed by selective etching using the first and second mask layers as a mask. Then, a field oxide film is formed on the principal surface by selective thermal oxidation using the remaining portions of the first and second mask material layers as a mask. At the same time, a parasitic channel stopper region is formed within the well region and below the field oxide film, the parasitic channel stopper region having the second conductivity type which is determined by the second impurity.

According to the above-described method according to the present invention, after the well region has been formed using the first mask material layer, an impurity for forming a parasitic channel stopper region is selectively ion-implanted using the same first mask material layer as a part of a mask. Therefore, the parasitic channel stopper region is self-aligned with the well region. The first and second mask layers are used as a part of a mask during the selective ion implantation of the parasitic channel stopper forming impurity and also used as a mask when the first and second mask material layers are selectively etched to form a mask for selective oxidation. Accordingly, the parasitic channel stopper region is also self-aligned with both the well region and the field oxide film.

Since the parasitic channel stopper region is self-aligned with both the well region and the field oxide film, it becomes unnecessary to provide any photomask alignment margin, and it is possible to increase the packing density by an amount corresponding to the margin.

In addition, it is only necessary to carry out two photolithography steps, that is, one which is executed when the first mask material layer is etched to provide an impurity introducing region, and the other which is executed when the first and second mask layers are formed. Accordingly, the number of required steps becomes smaller than that in the case of the conventional method by one, and this advantageously enables an increase in the production yield and a reduction in the production cost.

In the above-described method according to the present invention, after the well region of the second conductivity type has been formed and before the second mask material layer is formed, a well region of the first conductivity type can be formed in such a manner as to be self-aligned with the well region of the second conductivity type. More specifically, after an oxide layer has been formed by selectively oxidizing the surface of the well region of the second conductivity type using the first mask material layer as a mask, an impurity which determines the first conductivity type is selectively ion-implanted into the principal surface using the oxide layer as a mask and through the first mask material layer, thereby forming a well region of the first conductivity type. Thereafter, etching is performed so that the oxide layer which has been used as a mask is thinned or removed, and the above-described steps from the formation of the second mask material layer to the selective thermal oxidation are executed. According to this method, the parasitic channel stopper region is also self-aligned with the well region of the first conductivity type, advantageously.

BRIEF DESCRIPTION OF THE DRAWINGS

The above and other objects, features and advantages of the present invention will become more apparent with reference to the following description taken in conjunction with the accompanying drawings in which:

FIGS. 3a to 3e are sectional views showing another embodiment of the method of producing a CMOS type IC according to the present invention.

DETAILED DESCRIPTION OF THE INVENTION

A first embodiment of the present invention will be described hereinunder with reference to FIGS. 2a to 2d.

Figure 1A:
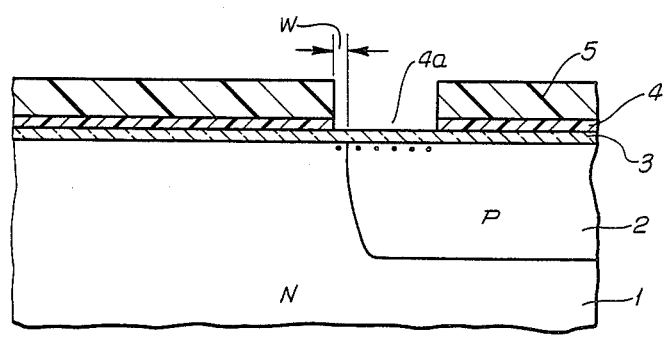
FIGS. 1a and 1b are sectional views showing steps of producing a CMOS type IC according to the prior art.
Figure 1B:
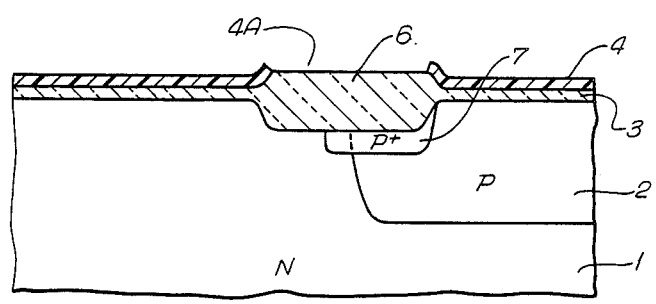
Figure 2A:
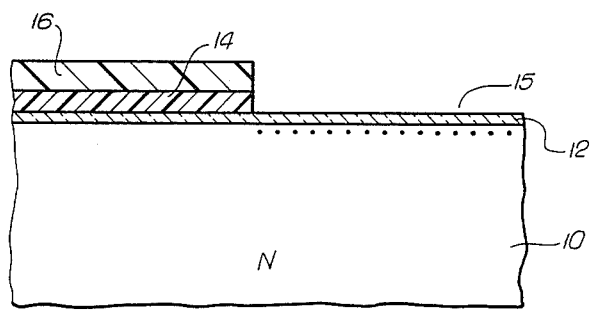
FIGS. 2a to 2d are sectional views showing one embodiment of the method of producing a CMOS type IC according to the present invention.

In the step shown in FIG. 2a, a relatively thin silicon oxide film constituting a surface protecting film 12 is formed on the surface of a semiconductor substrate 10 of N-type silicon by means of thermal oxidation, and silicon nitride is then deposited on this surface protecting film 12 by CVD (Chemical Vapor Deposition) to form a mask material layer 14 for selective oxidation. The surface protecting film 12 is provided for the purpose of decreasing the thermal stress generated on the basis of the difference in terms of the thermal expansion coefficient between silicon and silicon nitride. Then, the mask material layer 14 is selectively etched using a mask layer 16, such as photoresist, having an opening corresponding to a desired well forming pattern, thereby providing an impurity introducing region 15 corresponding to the well forming pattern. Thereafter, boron ions are selectively implanted into the surface of the substrate 10 using both the mask material layer 14 and the mask layer 16 as a mask and through the impurity introducing region 15 and the surface protecting film 12.

Figure 2B:
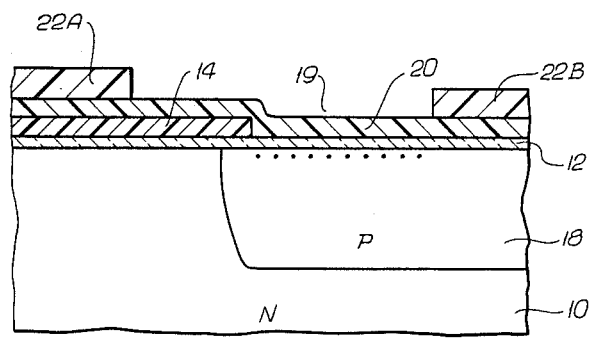

In the step shown in FIG. 2b, after the mask layer 16 has been removed, a heat treatment is carried out for driving-in the boron which has been implanted, to form a p-type well region 18. Then silicon nitride is deposited by CVD in such a manner that the silicon nitride covers the impurity introducing region 15 and the mask material layer 14, thereby forming a mask material layer 20 for selective oxidation. Thereafter, on the mask materia layer 20 are formed a mask layer 22A, such as photoresist, which corresponds to an active region pattern outside the well region 18, and a mask layer 22B, such as photoresist, which corresponds to an active region pattern inside the well region 18, whereby an impurity introducing region 19 which corresponds to a desired parasitic channel stopper pattern is defined between the stack portion of the mask material layers 14 and 20 and the mask layer 22B. I this case processings such as application of photoresist, light exposure and development are made common to the mask layers 22A ands 22B, and therefore the layers 22A and 22B are formed simultaneously. Thereafter, boron ions are selectively implanted into the surface of the well region 18 through the impurity introducing region 19 and the surface protecting film 12.

Figure 2C:
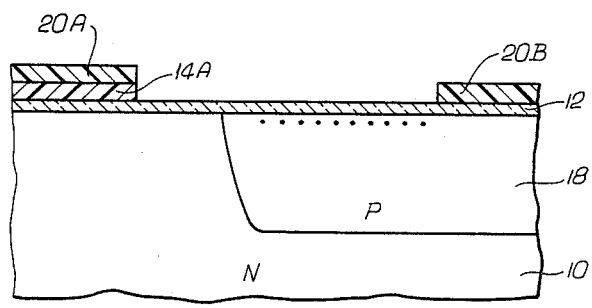

In the step shown in FIG. 2c, the mask material layers 14 and 20 are selectively etched using the mask layers 22A and 22B so that portions 14A, 20A and 20B corresponding to the mask layers 22A and 22B remain. Then, the mask layers 22A and 22B are removed.

In the step shown in FIG. 2d, the surface of the substrate 10 is selectively oxidized using the remaining portions 14A, 20A and 20B of the mask material layers 14 and 20 as a mask, thereby forming a relatively thick field oxide film 24, together with a $P^+$-type parasitic channel stopper region 26 which is located within the well region 18 and directly below the field oxide film 24, the region 26 containing the boron which has been implanted in the step shown in FIG. 2b.

According to the above-described series of steps, the parasitic channel stopper region 26 is self-aligned with both the well region 18 and the field oxide film 24.

Figure 2D:
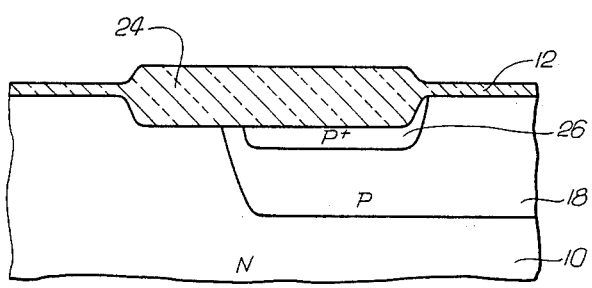

After the step shown in FIG. 2d, P- and N-channel MOS transistors can be fabricated in the N-type surface portion and the P-type well region 18, respectively, of the substrate 10 by the conventional method.

A second embodiment of the present invention will be explained below with reference to FIGS. 3a to 3e. In these figures, portions similar to those shown in FIGS. 2a to 2d are denoted by the same reference numerals.

In the step shown in FIG. 3a, processing similar to that which has been described with reference to FIG. 2d is carried out. More specifically, a surface protecting film 12 consisting of silicon oxide is formed on the surface of a substrate 10 of N-type silicon. Then, a mask material layer 14 for selective oxidation consisting of silicon nitride is formed, and a mask layer 16 of, for example, photoresist, is formed thereon. Thereafter, an impurity introducing region 15 is provided, and boron ions are selectively implanted into a portion of the surface of the substrate 10 which corresponds to the impurity introducing region 15. The mask layer 16 is then removed.

In the step shown in FIG. 3b, after a P-type well region 18 has been formed by a drive-in processing similar to that described above, a relatively thick oxide layer 17 is formed by selectively oxidizing the surface of the well region 18 using the mask material layer 14 as a mask. The oxide layer 17 may be formed simultaneously with the P-type region 18 by carrying out the drive-in processing for forming the region 18 in an oxidizing atmosphere. Then, phosphorus ions are selectively implanted into the surfaces of the substrate 10 using the oxide layer 17 as a mask in accordance with a desired N-type well forming pattern and through the mask material layer 14 and the surface protecting film 12.

In the step shown in FIG. 3c, the oxide layer 17 is etched in the direction of the thickness thereof using the mask material layer 14 as a mask, thereby thinning the oxide layer 17 to such an extent that the thickness thereof is substantially equal to that of the surface protecting film 12. For convenience, the thinned oxide layer is denoted by the reference numeral 17A, the layer 17A corresponding to the impurity introducing region 15. Thereafter, a heat treatment for driving-in the implanted phosphorus is carried out to form an N-type well region 21. In this case, the etching of the oxide layer 17 may be carried out after the heat treatment for the drive-in processing. In addition, the oxide layer 17 may be removed completely by etching, and a relatively thin silicon oxide layer may be thermally grown on the surface from which the oxide layer 17 has been removed, so as to be used as the oxide layer 17A.

Thereafter, silicon nitride is deposited by CVD in such a manner as to cover both the mask material layer 14 and the thin oxide layer 17A, thereby forming a mask material layer 20 for selective oxidation.

Figure 3D:
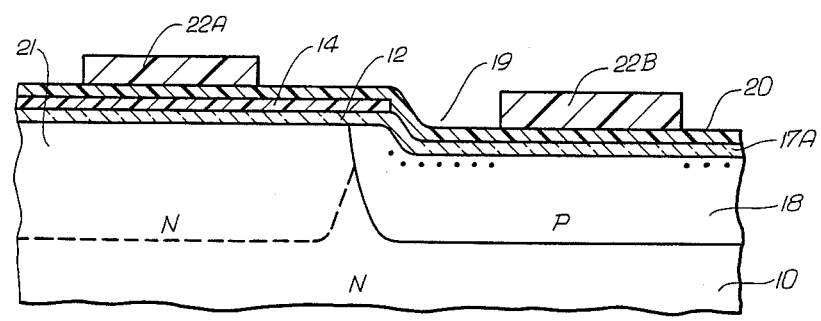

In the step shown in FIG. 3d, processing similar to that described above with references to FIG. 2b is carried out. More specifically, on the mask material layer 20 are formed a mask layer 22A, such as photoresist, which corresponds to an active region pattern within the N-type well region 21, and a mask layer 22B, such as photoresist, which corresponds to an active region pattern within the P-type well region 18, whereby an impurity introducing region 19 is defined between the stack portion of the mask material layers 14 and 20 and the mask layer 22B. Then, boron ions are selectively implanted into the surface of the P-type well region 18 through the impurity introducing region 19 and the thin oxide layer 17A.

Figure 3E:
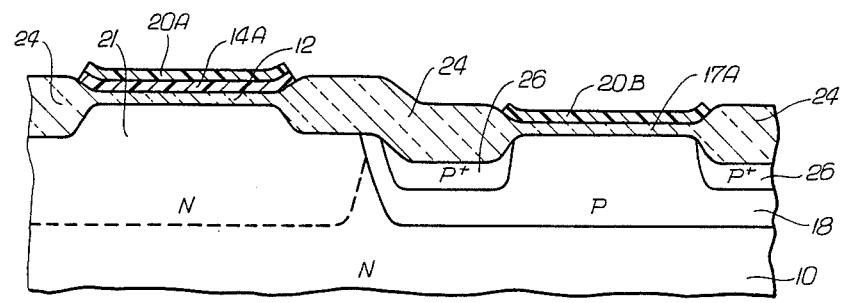

Thereafter, in a manner similar to that described above with reference to FIG. 2c, the mask material layers 14 and 20 are selectively etched using the mask layers 22A and 22B, and after the mask layers 22A and 22B have been removed, selective oxidation is carried out using the remaining portions 14A, 20A, and 20B of the mask material layers 14 and 20, as shown in FIG. 3e. As a result, a relatively thick field oxide film 24 is formed and at the same time, P+-type parasitic channel stopper regions 26 are formed within the P-type well region 18 and directly below the field oxide film 24, the regions 26 containing the boron which has been implanted in the step shown in FIG. 3d.

The well regions 18 and 21 may be formed by ion-implanting the respective impurities to sufficient required depth without accompanying the succeeding heat treatments which drive-in the impurities.

According to the above-described series of steps, the N-type well region 21 is self-aligned with respect to the P-type well region 18 and, in addition, the parasitic channel stopper regions 26 are self-aligned with respect to the N- and P-type well regions 21, 18 and the field oxide film 24.

After the step shown in FIG. 3e, P- and N-channel MOS transistors can be respectively fabricated in the N- and P-type well regions 21 and 18 by the conventional method.

As has been described above, the present invention enables the parasitic channel stopper region to be self-aligned with both the well region and the field oxide film. It is therefore possible to realize a CMOS type IC having a high packing density. Since a self-alignment process is adopted, the number of required photolithography steps can be reduced, so that it is possible to increase the production yield and reduce the production cost, advantageously.

Although a few embodiments of the present invention have been described in the foregoing, it will be obvious to those skilled in the art that various modifications and changes may be made without departing from the spirit and scope of the present invention.

I claim:

1. A method of producing a semiconductor integrated circuit, comprising the steps of:

preparing a semiconductor substrate of a first conductivity type and having a principal surface;

disposing a first mask material layer on said principal surface, said first mask material layer having a first impurity introducing region corresponding to a predetermined well forming pattern;

selectively doping a first impurity which determines a second conductivity type, opposite to said first conductivity type, into said principal surface through said first impurity introducing region, thereby forming a well region in said principal surface, said well region having said second conductivity type which is determined by said first impurity;

forming a second mask material layer in such a manner as to cover both said first impurity introducing region and said first mask material layer;

disposing first and second mask layers on said second mask material layer, said first and second mask layers respectively corresponding to a first active region pattern inside said well region and a second active region pattern outside said well region, thereby defining a second impurity introducing region corresponding to a predetermined parasitic channel stopper pattern between the stack portion of said first and second mask material layers and said first mask layer;

selectively ion-implanting a second impurity which determines said second conductivity type into the surface of said well region through said second impurity introducing region;

selectively removing said first and second mask material layers by selective etching using said first and second mask layers; and carrying out selective thermal oxidation using the remaining portions of said first and second mask material layers as a mask, whereby a field oxide film is formed on said principal surface, and a parasitic channel stopper region is formed within said well region and directly below said field oxide film, said parasitic channel stopper region having said second conductivity type which is determined by said second impurity.

2. A method according to claim 1, wherein said semiconductor substrate is made of silicon, said first and second mask material layers being made of silicon nitride, said method further comprising the step of forming an oxide film which is thinner than said field oxide film on said principal surface prior to the disposition of said first mask material layer on said principal surface.

3. A method of producing a semiconductor integrated circuit, comprising the steps of:
- preparing a semiconductor substrate of a first conductivity type and having a principal surface;
- disposing a first mask material layer on said principal surface, said first mask material layer having a first impurity introducing region corresponding to a predetermined well forming pattern;
- selectively doping a first impurity which determines a second conductivity type, opposite to said first conductivity type, into said principal surface through said first impurity introducing region, thereby forming a first well region in said principal surface, said first well region having said second conductivity type which is determined by said first impurity;
- forming an oxide layer corresponding to said first impurity introducing region on said principal surface by selectively oxidizing said principal surface using said first mask material layer as a mask;
- selectively doping a second impurity which determines said first conductivity type into said principal surface using said oxide layer as a mask and through said first mask material layer, thereby forming a second well region in said principal surface, said second well region having said first conductivity type which is determined by said second impurity;
- etching said oxide layer using said first mask material layer as a mask after said second impurity has been doped;
- forming a second mask material layer in such a manner as to cover both said first impurity introducing region and said first mask material layer;
- disposing first and second mask layers on said second mask material layer, said first and second mask layers respectively corresponding to a first active region pattern within said first well region and a second active region pattern within said second well region, thereby defining a second impurity introducing region corresponding to a predetermined parasitic channel stopper pattern between the stack portion of said first and second mask material layers and said first mask layer;
- selectively doping a third impurity which determines said second conductivity type into the surface of said first well region through said second impurity introducing region;
- selectively removing said first and second mask material layers by selective etching using both said first and second mask layers; and
- carrying out selective thermal oxidation using the remaining portions of said first and second mask material layers as a mask, whereby a field oxide film is formed on said principal surface, and a parasitic channel stopper region is formed within said first well region and directly below said field oxide film, said parasitic channel stopper region having said second conductivity type which is determined by said third impurity.

4. A method according to claim 3, wherein said first well region is formed by selectively ion-implanting said first impurity into said principal surface through said first impurity introducing region, and said second well region is formed by selectively ion-implanting said second impurity into said principal surface using said oxide layer as a mask and through said first mask material layer.

5. A method according to claim 3, wherein said first well region is formed by selectively and relatively shallowly ion-implanting said first impurity into said principal surface through said first impurity introducing region, and diffusing the ion-implanted first impurity into said principal surface relatively deeply by a heat treatment.

6. A method according to claim 5, wherein said heat treatment for forming said first well region is carried out in an oxidizing atmosphere, whereby said first well region and said oxide layer are simultaneously formed.

* * * * *